United States Patent
Starnes et al.

(10) Patent No.: US 11,815,946 B2
(45) Date of Patent: Nov. 14, 2023

(54) MODAL FREQUENCY SHIFTING FOR LOUDSPEAKER DEVICES

(71) Applicant: Google LLC, Mountain View, CA (US)

(72) Inventors: Mark William Starnes, Sunnyvale, CA (US); Andrew Phillis, Campbell, CA (US)

(73) Assignee: Google LLC, Mountain View, CA (US)

( * ) Notice: Subject to any disclaimer, the term of this patent is extended or adjusted under 35 U.S.C. 154(b) by 513 days.

(21) Appl. No.: 17/004,357

(22) Filed: Aug. 27, 2020

(65) Prior Publication Data

US 2020/0393871 A1 Dec. 17, 2020

Related U.S. Application Data

(63) Continuation of application No. 16/289,132, filed on Feb. 28, 2019, now Pat. No. 10,782,731.

(51) Int. Cl.
*G06F 1/16* (2006.01)
*H04R 5/02* (2006.01)
(Continued)

(52) U.S. Cl.
CPC .......... *G06F 1/1605* (2013.01); *G06F 1/1626* (2013.01); *H04R 5/02* (2013.01);
(Continued)

(58) Field of Classification Search
CPC ..... H04R 5/02; H04R 2499/15; G06F 1/1605; G06F 1/1626; H05K 5/0017; H05K 7/1417
See application file for complete search history.

(56) References Cited

U.S. PATENT DOCUMENTS 6,332,029 B1    12/2001    Azima et al.
6,478,109 B1    11/2002    Kam
(Continued)

FOREIGN PATENT DOCUMENTS

CN    1194085    9/1998
CN    1392977 A    1/2003
(Continued)

OTHER PUBLICATIONS

Office Action in Chinese Appln. No. 201980066783.4, dated Dec. 3, 2021, 27 pages (with English translation).
(Continued)

*Primary Examiner* — Andrew L Sniezek
(74) *Attorney, Agent, or Firm* — Fish & Richardson P.C.

(57) ABSTRACT

A system includes a chassis. The system also includes a panel extending in a plane, the panel having a first edge and a second edge opposite the first edge. The system further includes an actuator coupled to the panel at a first location, the actuator being adapted to cause vibration of the panel to generate sound waves. The system further includes a coupling assembly mechanically coupling the chassis to the panel at the second edge of the panel. The panel is fixedly connected to the chassis at the first edge to limit displacement of the panel from the chassis at the first edge during vibration of the panel by the actuator, and the coupling assembly allows displacement of the panel from the chassis at the second edge during the vibration of the panel by the actuator.

12 Claims, 8 Drawing Sheets

(51) Int. Cl.
H05K 5/00 (2006.01)
H05K 7/14 (2006.01)

(52) U.S. Cl.
CPC ......... H05K 5/0017 (2013.01); H05K 7/1417 (2013.01); *H04R 2499/15* (2013.01)

(56) References Cited

U.S. PATENT DOCUMENTS

| | | | |
|---|---|---|---|
| 7,355,325 | B2 | 4/2008 | Johansson et al. |
| 10,216,231 | B1 * | 2/2019 | Landick ............... G06F 1/1656 |
| 2006/0023898 | A1 * | 2/2006 | Katz ....................... G10H 1/32 |
| | | | 381/98 |
| 2011/0084917 | A1 | 4/2011 | Son |
| 2015/0195630 | A1 | 7/2015 | Yliaho et al. |
| 2016/0142827 | A1 | 5/2016 | Kanemaki |
| 2016/0360313 | A1 | 12/2016 | Mikalauskas |

FOREIGN PATENT DOCUMENTS

| | | |
|---|---|---|
| CN | 107087243 | 8/2017 |
| EP | 1170977 | 1/2002 |
| EP | 1197120 | 4/2002 |
| EP | 1414266 | 4/2004 |
| EP | 2630554 | 8/2013 |
| EP | 2894838 | 7/2015 |
| JP | 1999234772 | 8/1999 |
| JP | 2002510182 | 4/2002 |
| JP | 2008092430 | 4/2008 |
| JP | 2017531393 | 10/2017 |
| KR | 101704517 B1 | 2/2017 |
| WO | WO 97/09845 | 3/1997 |
| WO | WO 01/05189 | 1/2001 |
| WO | WO 2004/023199 | 3/2004 |
| WO | WO 2012052803 | 4/2012 |
| WO | WO-2016044361 A1 * | 3/2016 ............. H04R 7/045 |
| WO | WO 2016/052582 | 4/2016 |

OTHER PUBLICATIONS

Office Action in Korean Appln. 10-2021-7010930, dated Apr. 4, 2022, 13 pages (with English translation).
International Preliminary Report on Patentability in International Appln. No. PCT/US2019/061317, dated Sep. 10, 2021.
Allowance of Patent in Korean Appln. No. 1020217010930, dated Oct. 27, 2022, 3 pages (with English translation).
Decision to Grant a Patent in Japanese Appln. No. 2021-520406, dated Mar. 14, 2023, 5 pages (with English translation).
Office Action in Chinese Appln. No. 201980066783.4, dated Jan. 11, 2023, 22 pages (with Machine translation).
Office Action in Japanese Appln. No. 2021-520406, dated Aug. 23, 2022, 8 pages (with English translation).
PCT International Search Report and Written Opinion in International Appln. No. PCT/US2019/061317, dated Feb. 13, 2020, 16 pages.
Ting-Kong, "Design of an Adaptive Dynamic Vibration Absorber," Adelaide, Australia: Dept. Mech. Eng., Univ. Adelaide, Apr. 1999, 107 pages.

* cited by examiner

MODAL FREQUENCY SHIFTING FOR LOUDSPEAKER DEVICES

CROSS-REFERENCE TO RELATED APPLICATION

This application is a continuation of U.S. application Ser. No. 16/289,132, filed Feb. 28, 2019, the contents of which are incorporated by reference herein.

BACKGROUND

This specification relates to panel loudspeakers and, in particular, tuning the modal frequency of panel loudspeakers.

Many conventional loudspeakers produce sound by inducing piston-like motion in a diaphragm. Panel audio loudspeakers, such as distributed mode loudspeakers (DMLs), in contrast, operate by inducing uniformly distributed vibration modes in a panel with an electro-acoustic actuator. Typically, the actuators are electromagnetic or piezoelectric actuators.

In many applications, the panel of a DML is attached to a frame which supports the panel and houses other components of the DML. For example, the panel can be attached to a chassis along an edge of the panel (e.g., through continuous or discrete points of attachment). In such attachments, DMLs can feature compliant or rigid mountings that can provide a constant mechanical impedance at the boundary at a particular loudspeaker frequency. In some instances, a compliant mounting can provide a spring-like decreasing impedance with frequency.

SUMMARY

Coupling assemblies with variable mechanical impedances can be used to alter the boundary conditions of a modal component, that is, a component having resonant modes, e.g., modal panels. For example, embodiments of such coupling assemblies can include active components such as an actuator controlled by an electronic control module external to the actuator. As another example, implementations of such coupling assemblies can include passive components, such as a mass-spring damper system. The boundary conditions can be altered in such a way as to shift the resonant frequency of the modal components.

In general, in a first aspect, the invention features a system that includes a chassis and a panel extending in a plane, the panel having a first edge and a second edge opposite the first edge. The system also includes an actuator coupled to the panel at a first location, the actuator being adapted to cause vibration of the panel to generate sound waves. The system further includes a coupling assembly mechanically coupling the chassis to the panel at the second edge of the panel. The panel is fixedly connected to the chassis at the first edge to limit displacement of the panel from the chassis at the first edge during vibration of the panel by the actuator, and the coupling assembly allows displacement of the panel from the chassis at the second edge during the vibration of the panel by the actuator.

Implementations of the system can include one or more of the following features and/or one or more features of other aspects. For example, the system can include an electronic control module in communication with the actuator and the coupling assembly, the electronic control module being programmed to simultaneously activate the actuator and the coupling assembly to vary vibrational modes supported by the panel.

In some implementations, the coupling assembly is a spring-damper-mass system tuned to absorb energy at one or more frequencies in a range from 200 Hz to 20 kHz.

In some implementations, the coupling assembly is a passive coupling assembly, while in some implementations the coupling assembly is an active coupling assembly.

In some implementations, the coupling assembly includes a second actuator configured to vary a mechanical coupling between the panel and the chassis at the second edge. The second actuator can include a first component fixedly connected to the panel and a second component fixedly connected to the chassis. One of the first and second components can include a magnet and the other of the first and second components can include a coil.

In some implementations, the second actuator is a distributed mode actuator. The distributed mode actuator can be a one-dimensional distributed mode actuator.

In some implementations, the coupling assembly includes a mass sufficient to change a modal distribution of vibrations supported by the panel compared to the panel without the coupling assembly. The coupling assembly can include a compliant material coupling the mass to the panel.

In another aspect, the invention features a system that includes a panel extending in a plane. The system also includes a first actuator coupled to the panel at a first location, the first actuator being adapted to create a force to cause vibration of the panel to generate sound waves. The system further includes a second actuator coupled to the panel at a second location different from the first location, the second actuator being adapted to vary a mechanical impedance of the panel at the second location. The system also includes an electronic control module in electrical communication with the first and second actuators and programmed to simultaneously activate the first and second actuators during operation of the system to cause vibration of the panel and to cause the second actuator to vary a mechanical impedance of the panel at the second location to damp a vibration of the panel at one or more frequencies in a range from 200 Hz to 20 kHz.

In some implementations, the second location is at an edge of the panel.

In another aspect, the invention features a mobile device that includes an electronic display panel extending in a plane, the electronic display panel having a first edge and a second edge opposite the first edge. The mobile device also includes a chassis attached to the electronic display panel and defining a space between a back panel of the chassis and the electronic display panel. The electronic display panel further includes an actuator housed in the space and attached to a surface of the electronic display panel. The mobile device also includes a coupling assembly mechanically coupling the chassis to the electronic display panel at the second edge of the panel. The mobile device further includes an electronic control module housed in the space, the electronic control module being in communication with the actuator. The electronic display panel is fixedly connected to the chassis at the first edge to prevent displacement of the electronic display panel from the chassis at the first edge during vibration of the panel by the actuator, and the coupling assembly allows displacement of the panel from the chassis at the second edge during the vibration of the panel by the actuator.

Among other advantages, embodiments feature systems that allows the mechanical impedance of a component having resonant modes, such as a modal panel, to be tuned so as to change the frequency at which the modal component exhibits certain modes. Shifting the modes to a desired frequency can optimize the system output, e.g., increase or decrease the sound pressure output by the system. In addition, the impedance can be tuned to absorb energy of the panel-actuator system at frequencies that the system demonstrates excessive output. In contrast to systems that include compliant mountings that provide only a constant mechanical impedance or an impedance that decreases with frequency, the disclosed embodiments can allow for an impedance that changes with the oscillation frequency of the modal component.

Other advantages will be evident from the description, drawings, and claims.

BRIEF DESCRIPTION OF THE DRAWINGS

Like reference symbols in the various drawings indicate like elements.

DETAILED DESCRIPTION

The disclosure features actuators for panel audio loudspeakers, such as distributed mode loudspeakers (DMLs). Such loudspeakers can be integrated into a mobile device, such as a mobile phone. For example, referring to FIG. 1, a mobile device 100 includes a device chassis 102 and a touch panel display 104 including a flat panel display (e.g., an OLED or LCD display panel) that integrates a panel audio loudspeaker. Mobile device 100 interfaces with a user in a variety of ways, including by displaying images and receiving touch input via touch panel display 104. Typically, a mobile device has a depth of approximately 10 mm or less, a width of 60 mm to 80 mm (e.g., 68 mm to 72 mm), and a height of 100 mm to 160 mm (e.g., 138 mm to 144 mm).

Figure 1:
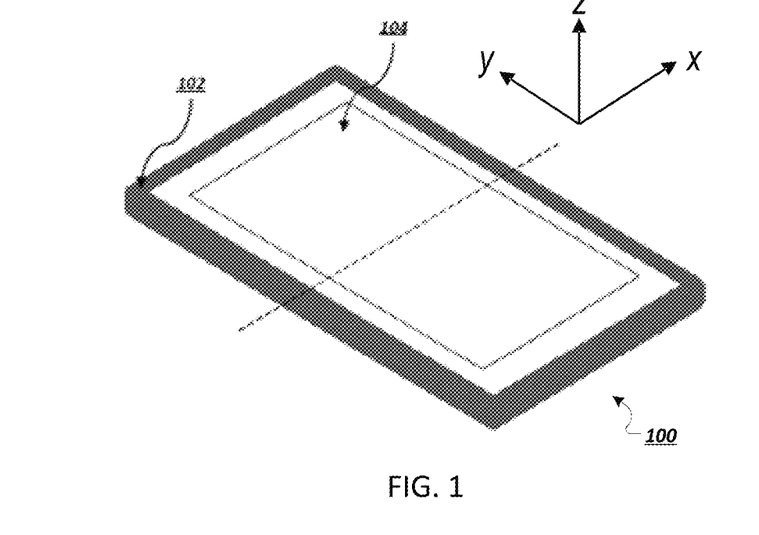
FIG. 1 is a perspective view of an embodiment of a mobile device.

Mobile device 100 also produces audio output. The audio output is generated using a panel audio loudspeaker that creates sound by causing the flat panel display to vibrate. The display panel is coupled to an actuator, such as a distributed mode actuator, or DMA. The actuator is a component arranged to provide a force to a panel, such as touch panel display 104, causing the panel to vibrate. The vibrating panel generates human-audible sound waves, e.g., in the range of 20 Hz to 20 kHz.

Figure 2:
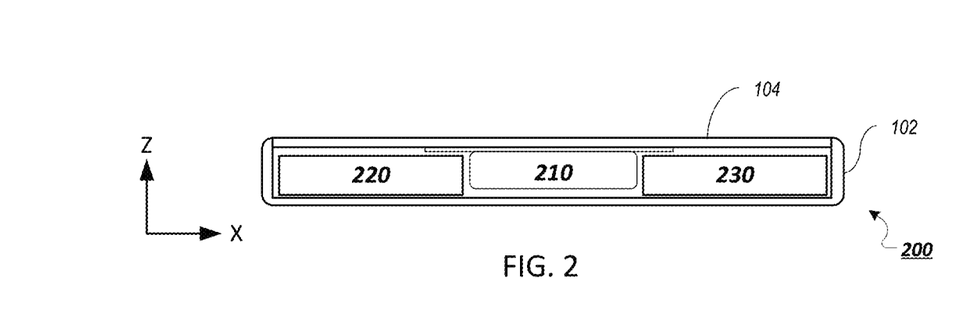
FIG. 2 is a schematic cross-sectional view of the mobile device of FIG. 1.

FIG. 1 also shows a dashed line that corresponds to the cross-sectional direction shown in FIG. 2. Referring to FIG. 2, a cross-section 200 of mobile device 100 illustrates device chassis 102 and touch panel display 104. A Cartesian coordinate system with X, Y, and Z axes, is provided for ease of reference. Device chassis 102 has a depth measured along the Z-direction and a width measured along the X-direction. Device chassis 102 also has a back panel, which is formed by the portion of device chassis 102 that extends primarily in the X-Y-plane. Mobile device 100 includes an actuator 210, which is housed behind display 104 in chassis 102 and attached to the back side of display 104. The actuator 210 can be one of a variety of different actuator types, such as an electromagnet actuator or a piezoelectric actuator. Generally, actuator 210 is sized to fit within a volume constrained by other components housed in the chassis, including an electronic control module 220 and a battery 230.

In some implementations, the panel is pinned to the chassis at one or more points. This means that, at these points, translational movement of the panel from the chassis is prevented. However, when the panel is pinned, it is able to rotate about the one or more points.

In certain implementations, the panel is clamped to the chassis at one or more points. That is, at these points, both translation and rotation of the panel is prevented.

Figure 3A:
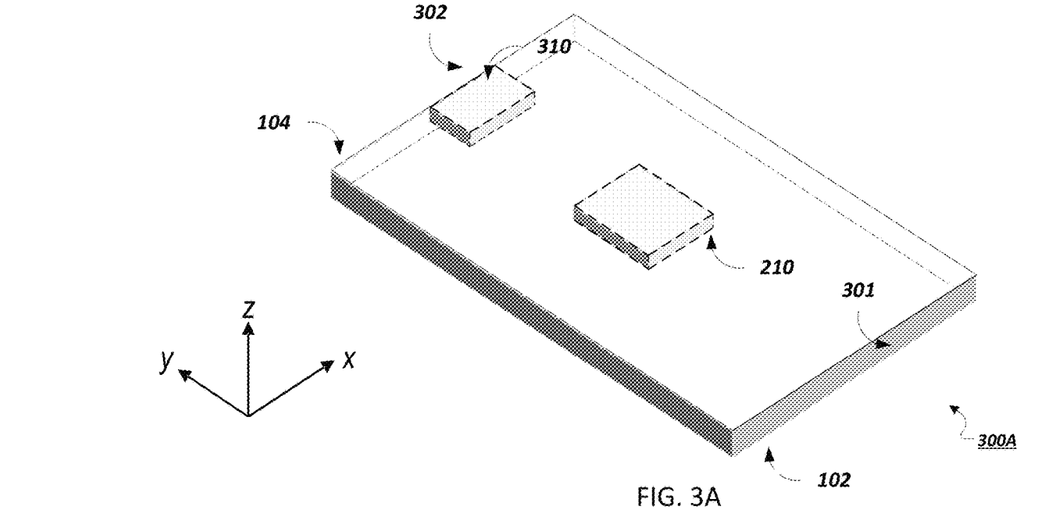
FIG. 3A is a perspective view of a mobile device showing a coupling assembly and an actuator.
Figure 3B:
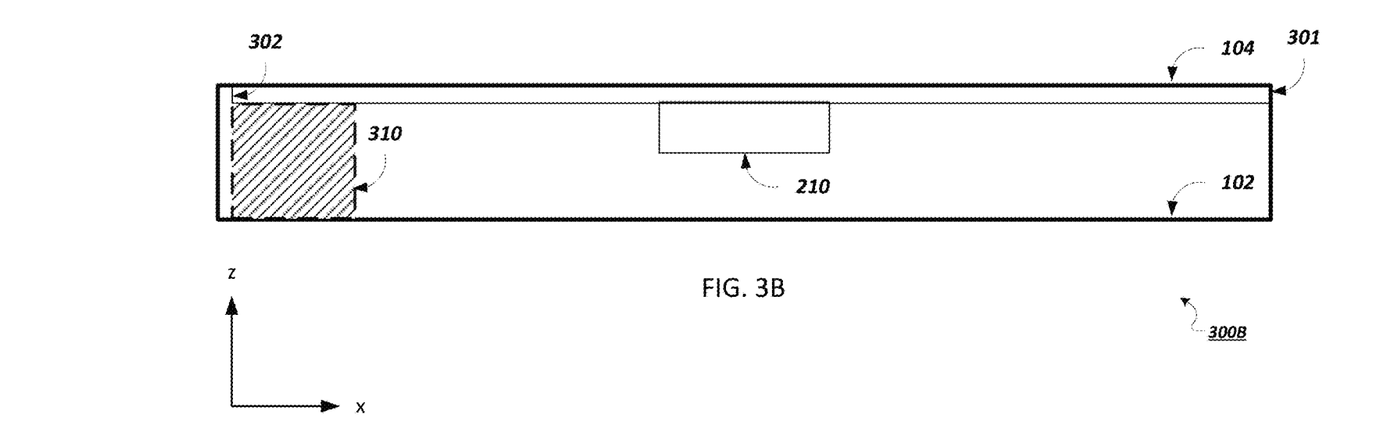
FIG. 3B is a cross-sectional view of the mobile device of FIG. 3A showing the coupling assembly and actuator.

Referring to FIGS. 3A and 3B, a perspective view 300A of a mobile device and a cross-sectional view 300B of the same mobile device shows actuator 210 and a coupling assembly 310. Actuator 210 is coupled to panel 104. By virtue of their coupling, actuator 210 can cause panel 104 to vibrate relative to the Z-axis.

Panel 104 has a first edge 301 and a second edge 302, which is opposite the first edge. Panel 104 is attached to chassis 102 at the first edge 301, limiting the displacement of the panel in the Z-direction when actuator 210 is activated. For example, panel 104 can be attached to chassis 102 by a soft layer, e.g., a tape or a foam. For example, the soft layer can be a tape having a Young's modulus between 1 and 6 MPa and a thickness between 0.1 mm and 0.4 mm. As another example, the soft layer can be a foam having a compliance between 8.3E-5 m/N and 8.35E-6 m/N. Coupling assembly 310 is attached to panel 104 closer to the second edge 302 than to the first edge 301. Although the first edge 301 is prevented from moving by virtue of its coupling to chassis 102, second edge 302 is not in contact with chassis 102, allowing the panel to move when it is vibrated by actuator 210 or coupling assembly 310. Because coupling assembly 310 is in contact with panel 104, it is able to apply a boundary condition to the panel. A boundary condition of a modal component refers to a physical component attached to the modal component, e.g., at or close to the edge of the modal component, that changes the frequency response of the modal component.

The remaining edges of panel 104 can be either constrained, like first edge 301, or free, like second edge 302. For example, panel 104 can be constrained at up to each one of its edges.

For example, when coupling assembly 310 includes an adhesive tape, e.g., a foam adhesive tape, the displacement of panel 104 is limited to a fraction of the thickness of the tape. The displacement can be about one quarter to three quarters of the thickness of the tape, e.g., one third of the tape thickness, one half of the tape thickness, two thirds of the tape thickness. In general, when panel 104 is not constrained by any boundary condition, the edge of the panel may be displaced by up to 5 mm (e.g., 4.95 mm or less, 4.9 mm or less, 4.85 mm or less), during operation of the actuator. In contrast, when panel 104 is constrained by a boundary condition, the displacement of the panel edge may be 0.2 mm or less (e.g., 0.19 mm or less, 0.18 mm or less, 0.17 mm or less).

Actuator 210 can excite panel 104 into one or more resonant modes. In general, coupling assembly 310 is a component that provides a mechanical impedance to alter the frequency response of the panel-actuator system such that the one or more modes of the panel 104 are shifted in frequency. For example, without the impedance provided by coupling assembly 310, panel 104 may resonate at a first frequency. In contrast, coupling assembly 310 can shift the resonance frequency of panel 104 from the first frequency to a second frequency by providing a mechanical impedance to the panel. In some implementations, coupling assembly 310 can exhibit a range of impedances tuned to the oscillation frequency of actuator 210.

In some implementations, coupling assembly 310 is an active coupling assembly. An active coupling assembly is one that is able to vary the mechanical impedance it provides to the panel-actuator system. For example, an active coupling assembly can be an actuator, such as an electromagnetic actuator.

Figures 4A, 4B:
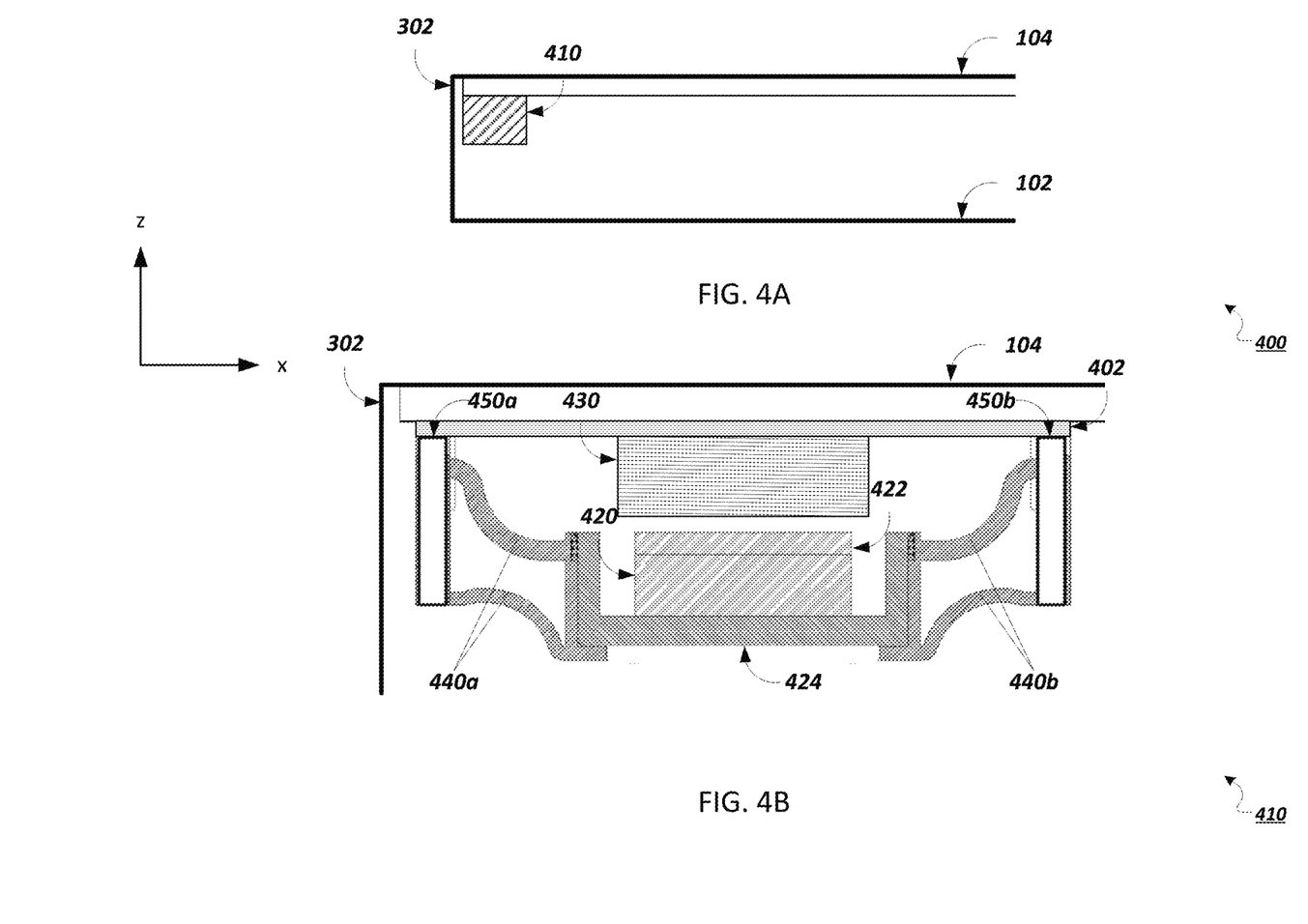
FIG. 4A is a cross-sectional view of a mobile device showing an active coupling assembly.
FIG. 4B is a cross-sectional view of the active coupling assembly shown in FIG. 4A.

Referring to FIG. 4A, a cross section 400 of a mobile device shows the placement of an active coupling assembly 410 relative to the edge of the mobile device. FIG. 4B shows an implementation of active coupling assembly 410, which is attached to panel 104 by a coupling plate 402. In FIG. 4B, active coupling assembly 410 is an electromagnetic actuator, although other types of actuators can also be used. The electromagnetic actuator includes a magnet 420 that fits within a coil 430, which is attached to a coupling plate 402. Attached to magnet 420 is a pole piece 422 that acts to focus the magnetic field produced by the magnet, such that the magnetic field runs along the X-direction. Magnet 420 is attached to a cup 424, which is mechanically coupled by two elastic components, 440a and 440b, (e.g., springs) to a rigid frame, shown as posts 450a and 450b. Elastic components 440a and 440b connect cup 424 to posts 450a and 450b, respectively. Elastic components 440a and 440b can flex to allow magnet 420 and cup 424 to move in the Z-direction. Posts 450a and 450b are rigidly attached to coupling plate 402.

In general, when active coupling assembly 410 is at rest, cup 424 is positioned in the z-direction such that magnet 420 and pole piece 422 fit within a space defined by coil 430. To better show the components of active coupling assembly 410, the assembly shown in FIG. 4B is not at rest; rather, cup 424 is displaced in the z-direction from its rest position.

When coil 430 is energized, magnet 420 and cup 424 are displaced in the Z-direction, causing the magnet-cup system to exert a force on panel 104. For example, electronic control module 220 can energize coil 430 by running a sinusoidal current through the coil causing the magnet 420 and cup 424 to be sinusoidally displaced. The sinusoidal displacement causes the magnet-cup system to exert an oscillatory force on panel 104. The force exerted on panel 104 by active coupling assembly 410 can be used to affect the vibration of panel 104 induced by actuator 210.

Panel 104 can experience harmonic motion that causes the panel to move coil 430 relative to magnet 420. The movement of coil 430 in the magnetic field of magnet 420 induces a current through the coil, the current inducing a magnetic field that surrounds the coil. When coil 430 is short-circuited, the generated magnetic field opposes the magnetic field of magnet 420, therefore restricting the movement of the coil and, in turn, causing a force on panel 104 that dampens the harmonic motion. When instead coil 430 is an open circuit, no current can flow through the coil, and therefore the movement of the coil is not restricted by any magnetic field surrounding the coil.

Figure 4C:
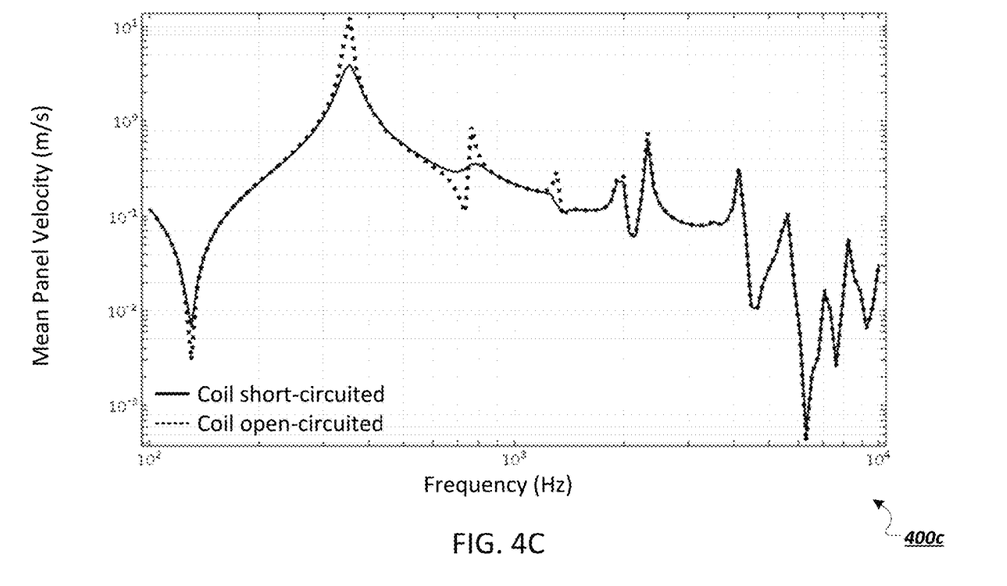
FIG. 4C is a plot showing the effects on a simulated panel of short circuiting and open circuiting a voice coil of an active coupling assembly.
Figure 4D:
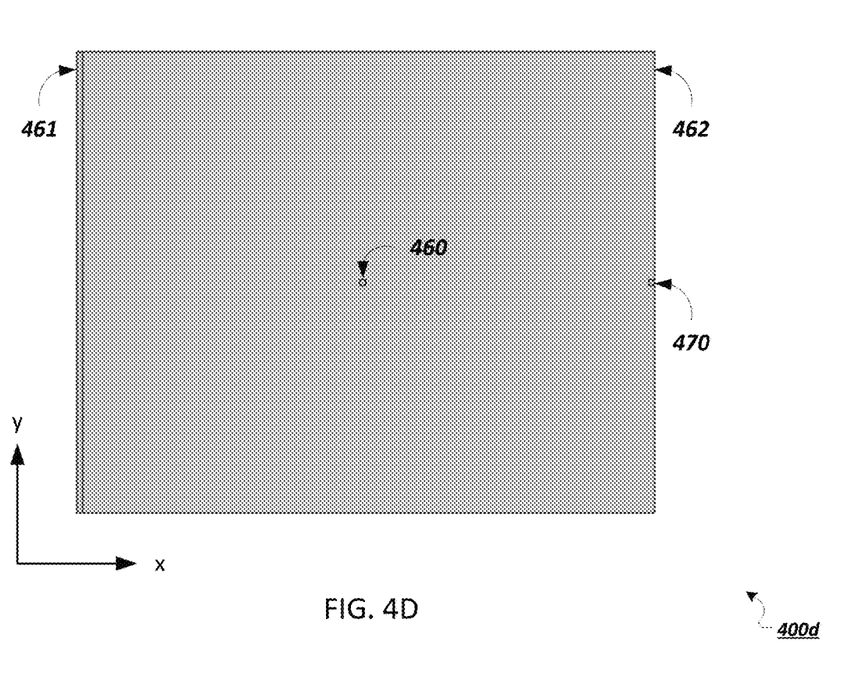
FIG. 4D is the simulated panel described with regard to FIG. 4C.

The effects of open-circuiting and short-circuiting coil 430 can be illustrated by numerical simulation. For example, FIG. 4C shows a plot 400c of the mean velocity of a simulated panel for a short-circuited arrangement and open-circuited arrangement corresponding to having a voice coil of an active coupling assembly attached to the panel. Plot 400c was generated based on an 8 cm by 10 cm aluminum plate, the layout of which is shown in FIG. 4D. Here, a panel 400d extends 8 cm along the y-direction and 10 cm along the x-direction. A first edge 461 is supported by a foam, while an active coupling assembly 470 is attached to the panel at a second edge 462, opposite the first edge. Active coupling assembly 470 is an electromagnet actuator, which includes a voice coil. Panel 400d has an impedance that is approximately equal to that of active coupling assembly 470. A force of 1 N is applied at a center point 460 of panel 400d, normal to the XY-plane.

Referring again to FIG. 4C, the horizontal axis of plot 400c shows frequency, measured in Hz, while the vertical axis shows velocity, measured in m/s. A solid line and a dotted line show the mean velocity of panel 400d with respect to frequency when the voice coil of active coupling assembly 470 is short-circuited and open-circuited, respectively. At certain frequencies, short-circuiting the voice coil of active coupling assembly 470 results in damping the panel-actuator system, i.e., reducing the fluctuation of the mean panel velocity of the system. Specifically, for frequencies of approximately 350 Hz, 750 Hz, and 1500 Hz, the mean panel velocity of the system fluctuates less with frequency when the voice coil of the active coupling assembly is short-circuited as compared to when the voice coil is not short-circuited.

Referring back to FIGS. 4A and 4B, the circuit formed by coil 430 can include a frequency-dependent electrical impedance. Electronic control module 220 can therefore vary the damping force on the panel, by varying the frequency of a signal applied to coil 430. The damping force can be used to affect the panel response by either inhibiting or promoting specific modes.

Although FIG. 4A shows magnet 420 and cup 424 being mechanically coupled by elastic components 440a and 440b to posts 450a and 450b, while coil 430 is attached to coupling plate 402, other orientations can be chosen. For example, coil 430 can be attached to a rigid frame, while magnet 420, either alone or attached to cup 424, can be attached to coupling plate 402. In other implementations, coupling plate 402 is omitted and the components of active coupling assembly 410 are attached directly to panel 104.

In general, while actuator 210 is activated, electronic control module 220 is able to alter the frequency response of panel 104 by altering the oscillation frequency, displacement, and/or oscillation amplitude of the active coupling assembly 410 by energizing the coil with a DC or AC signal. The active coupling assembly 410 can be driven using a control signal generated by electronic control module 220. In some implementations, active coupling assembly 410 can be controlled using a secondary control signal derived from a primary control signal that controls actuator 210. One particular advantage of using a secondary control signal derived from a primary control signal is that certain features of the waveform can be shared between the two signals. For example, the primary and secondary control signals can have matching frequencies, amplitudes, wave shapes, or other characteristics.

While the active coupling assembly 410 can be driven by a secondary control signal derived from a primary control signal, in other implementations, the active coupling assembly can be driven by a separate signal that is independent of the control signal that drives actuator 210.

In some embodiments, coupling assembly 310 can be a passive, rather than active, component. For example, a passive coupling assembly can provide a mechanical impedance that is dependent entirely on the mechanical properties of the assembly, rather than being responsive to signals from a control unit. In some embodiments, a passive coupling assembly can be actualized using a mass and a compliant material, for example.

Figure 5A:
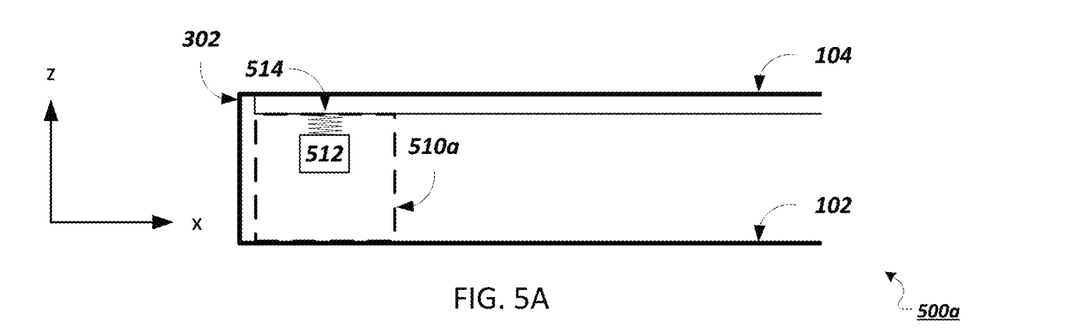
FIG. 5A is a cross-sectional view of a mobile device showing a passive coupling assembly that includes a spring and a mass.

Referring to FIG. 5A, a mobile device 500a, shown in partial cross-section, includes a passive coupling assembly 510a, which includes a mass 512 and a spring 514. Mass 512 is coupled to spring 514, which in turn is coupled to panel 104 at one end and, at an opposite end, to mass 512. Spring 514 allows mass 512 to oscillate in response to the oscillation of panel 104. When panel 104 vibrates in the Z-direction, the addition of mass 512 results in a boundary condition for the panel that provides a mechanical impedance to the vibration of the panel. The interaction between spring 514 and panel 104 affects the magnitude of the response of the panel to the driving signal of actuator 210. Therefore, passive coupling assembly 510a can act as a sink for the kinetic energy of panel 104. Depending on the oscillation of the mass-spring system, the frequency the panel showing maximum output will change. For example, mass 512 and spring 514 can absorb energy at one or more frequencies in a range from 200 Hz to 20 kHz.

The physical properties of the components of passive coupling assembly 510a can be chosen such that the modes of panel 104 are shifted in frequency. For example, various masses can be chosen for mass 512, resulting in a different inertial reaction force being applied to panel 104. For example, the mass can range from 1 g to 10 g. Generally, the mass can be chosen so that the mass-spring system exhibits a desired resonance frequency. For example, an appropriate mass and spring can be chosen such that the mass-spring system exhibits resonance frequencies in the range of 100 Hz to 1 kHz.

In addition, the shape of mass 512 can be altered. As another example, the spring constant of spring 514 can be altered. While FIG. 5A shows spring 514 as a helical spring, other shapes can be used, e.g., a leaf spring, a conical spring, or a beam. In addition to changing the shape of spring 514, the material of the spring can be chosen to achieve a desired range of resonance frequencies from the mass-spring system. For example, the spring can be a combination of one or more materials including foams or adhesive tapes.

In addition to changing the physical properties of the components of passive coupling assembly 510a, the configuration of the components can also be chosen to alter the boundary condition of panel 104. That is, while FIG. 5A shows a configuration in which spring 514 is attached to panel 104 and mass 512 is attached to the spring, an alternative configuration can be chosen.

For example, spring 514 can be attached to chassis 102 at one end and at another end to mass 512, which is attached to panel 104. The mass-spring system exhibits a resonance frequency. Depending on the resonance frequency exhibited by the mass-spring system, the vibrational modes of the panel will increase or decrease in frequency.

As another example, spring 514 and mass 512 can be attached in parallel, i.e., adjacent to one another. That is, spring 514 is attached at one end to panel 104 and at the other end to chassis 102, while mass 512 is attached to panel 104.

While the previous examples describe different configurations of the components of passive coupling assembly 510a, in some implementations, a passive coupling assembly can include additional components, for example, a damper element. The damper element can be any device that is capable of resisting motion while satisfying other design and manufacturing constraints associated with the device (e.g., sufficiently compact to fit within the allotted space, chemically inert, sufficiently inexpensive, etc.).

Figure 5B:
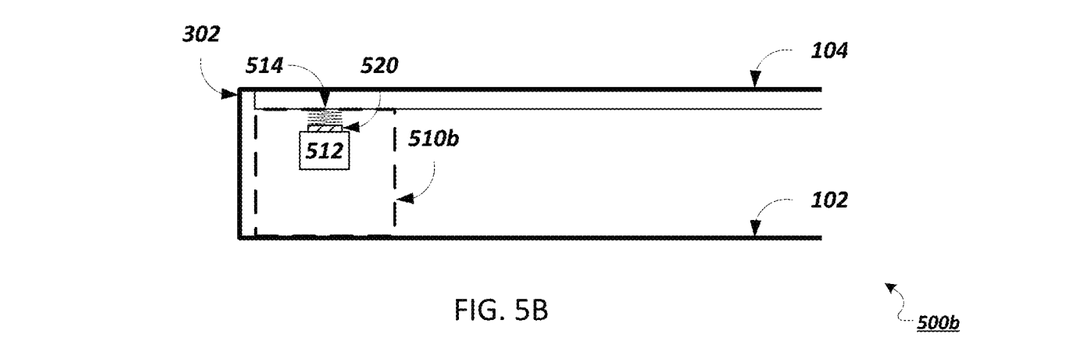
FIG. 5B is a cross-sectional view of a mobile device showing a passive coupling assembly that includes a spring, a damper element, and a mass.

Referring to FIG. 5B, a mobile device 500b, shown in partial cross-section, includes a passive coupling assembly 510b that includes a damper element 520. Damper element 520 is capable of resisting motion in the Z-direction and can be formed from a foam, a pressure sensitive adhesive, an elastomer, or a spring, such as a helical or leaf spring. Damper element 520 is mechanically coupled in series with mass 512 and spring 514. That is, spring 514 is attached to panel 104 at one end and to damper element 520 at the other end. While spring 514 and damper element 520 are discrete elements, more generally, the spring and damper element formed as a single damped spring component. Furthermore, in yet other implementations, spring 514 and damper element 520 can be positioned in parallel to one another. For example, spring 514 and damper element 520 can be attached at one end to panel 104 and at another end to mass 512.

Figure 5C:
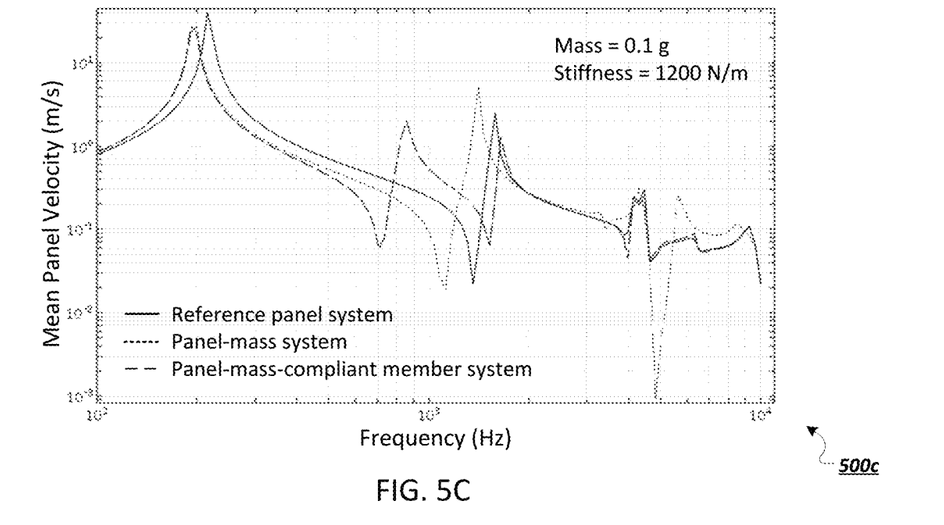
FIG. 5C is a plot showing the effects of adding a mass and a mass and compliant member to a panel.

Referring to FIG. 5C, a plot 500c shows how the mean velocity of a simulated panel is affected by adding a mass to one end of the panel. Plot 500c also shows how the mean velocity of the panel is affected by adding a mass and a spring, which are attached such that the spring attaches the mass to the panel, as shown in FIG. 5A. The spring is simulated as a compliant mounting, such as a foam. Plot 500c was generated using a simulated panel, which is an 8 cm by 5 cm aluminum plate having a thickness of 0.05 cm. A force source is applied at the center of the panel, the force being used to drive the panel at a particular frequency of vibration.

Plot 500c includes a solid line that shows the mean velocity of a reference panel system with respect to frequency. The reference panel system is mounted along edge 461 with a material having a Young's Modulus of (1+1i) MPa, where i is the imaginary unit, i.e., the square root of −1. The reference panel system has no coupling assembly.

Plot 500c further includes a dotted line that shows the mean panel velocity when a 0.1 g mass is attached at first edge 461; while a dashed line shows the mean panel velocity when a 0.1 g mass is attached to the panel by a compliant mounting having a compliance of 0.38E-3 m/N.

The peaks in the mean panel velocity correspond to modes of the panel. The solid line shows that the reference panel system exhibits a fundamental mode at approximately 220 Hz. The addition of the mass drops the fundamental mode of the panel to a frequency below 200 Hz, as shown by the dotted line. The addition of the compliant member to the panel-mass system does not affect the frequency of the fundamental mode, as shown by the dotted line having approximately the same peak frequency as that of the dashed line, as the resonance of the panel-mass-compliant member is at a frequency significantly higher than the panel (e.g., greater than 500 Hz).

The reference panel system exhibits a first higher order mode at approximately 1500 Hz. The addition of the mass decreases the frequency of the first mode with respect to the reference panel system, as shown by the peak along the dotted line at a frequency below 1500 Hz. The addition of the mass and the compliant member increases the frequency of the first mode with respect to the reference panel system, as shown by the peak along the dashed line at a frequency above 1500 Hz.

Plot 500c also shows that at approximately 830 Hz, the panel-mass-compliant member system exhibits a mode that is not exhibited by either the reference panel system or the panel-mass system, as shown by the peak in velocity of the dashed line.

The mass used to generate plot 500c illustrates the effect on the panel response for the passive comping assemblies described with regard to FIG. 5C. In general, different masses can be chosen. Just as other masses can be chosen, compliant mountings with different stiffnesses can be chosen.

Figure 5D:
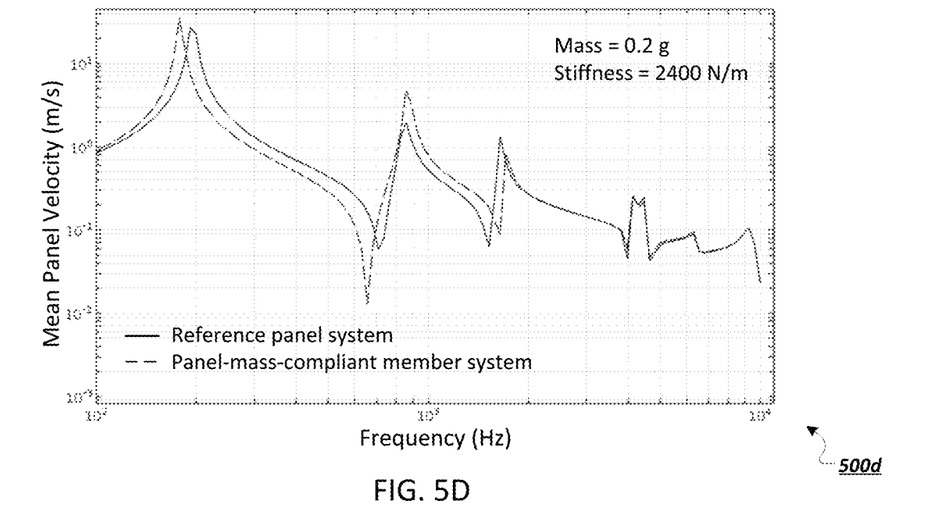
FIG. 5D is a plot showing the effects of adding a mass and a compliant member to the panel of FIG. 5C.

Like FIG. 5C, FIG. 5D is a plot 500d that shows how the mean velocity of a simulated 8 cm by 5 cm aluminum panel is affected by increasing the mass at one end of the panel while scaling the compliance of the attachment of the mass to the panel by a proportional amount. Plot 500d includes a solid line, which shows the mean velocity of the reference panel system with a 0.1 g mass attached to the panel by a compliant mounting having a compliance of 8.3E-4 m/N (i.e., a stiffness of 1200 N/m). The dashed line of FIG. 5D shows the mean panel velocity of a panel-actuator-mass system with a 0.2 g mass attached to the panel by a compliant mounting having a compliance of 4.2E-4 m/N (i.e., a stiffness of 2400 N/m). The 0.2 g mass and 4.2E-4 m/N compliant member are attached to the panel at the same locations as the 0.1 g mass and 8.3E-4 m/N compliant member of FIG. 5B.

Plot 500d shows that as the mass and stiffness increase, the frequency of the fundamental mode decreases from approximately 200 Hz, to a frequency of less than 200 Hz. While the frequency of the fundamental mode decreases with increased mass and stiffness, the frequency of the first mode increases with increasing mass and stiffness.

In some implementations, a passive coupling assembly can include a combination of components in series and in parallel. For example, a mass and spring can be in series with one another while a damper element is configured in parallel to the mass and spring.

Figure 6:
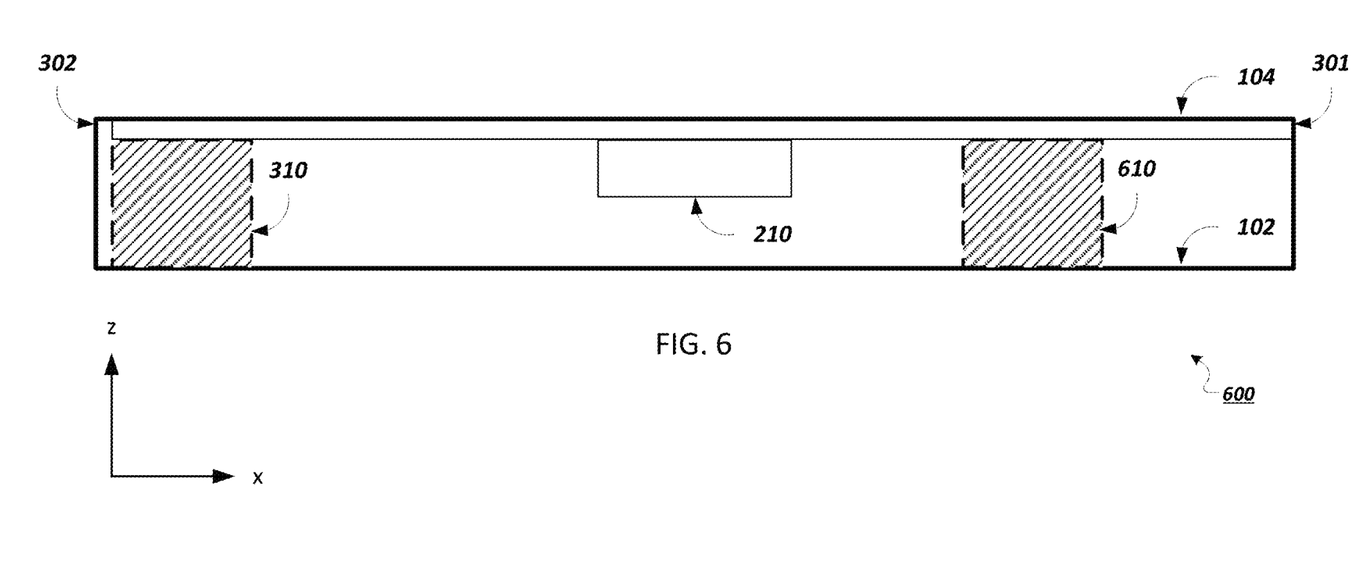
FIG. 6 is a cross-sectional view of a mobile device that includes two coupling assemblies attached at different locations of a panel of the mobile device.

In the foregoing example, each device includes only a single coupling assembly to control the mechanical impedance of the DML at its edge. However, more generally, embodiments can feature devices with more than one such coupling assembly. For example, devices can include two, three, four, or more coupling assemblies. In some cases, each edge of the panel is coupled to the chassis by a different coupling assembly. In certain embodiments, a device can include coupling assemblies at locations away from the panel edge. For example, referring to FIG. 6, a mobile device 600, shown in cross-section, includes two coupling assemblies attached at different locations of panel 104. Specifically, in addition to coupling assembly 310, mobile device 600 also includes a second coupling assembly 610 attached to panel 104 at a location away from the edge of the panel. The additional coupling assembly can provide an additional degree of freedom to control the mechanical impedance to the panel-actuator system to further control the modal behavior of panel 104. Generally, the position of coupling assembly 610 can be chosen so as to vary the modal response of the DML.

Figure 7:
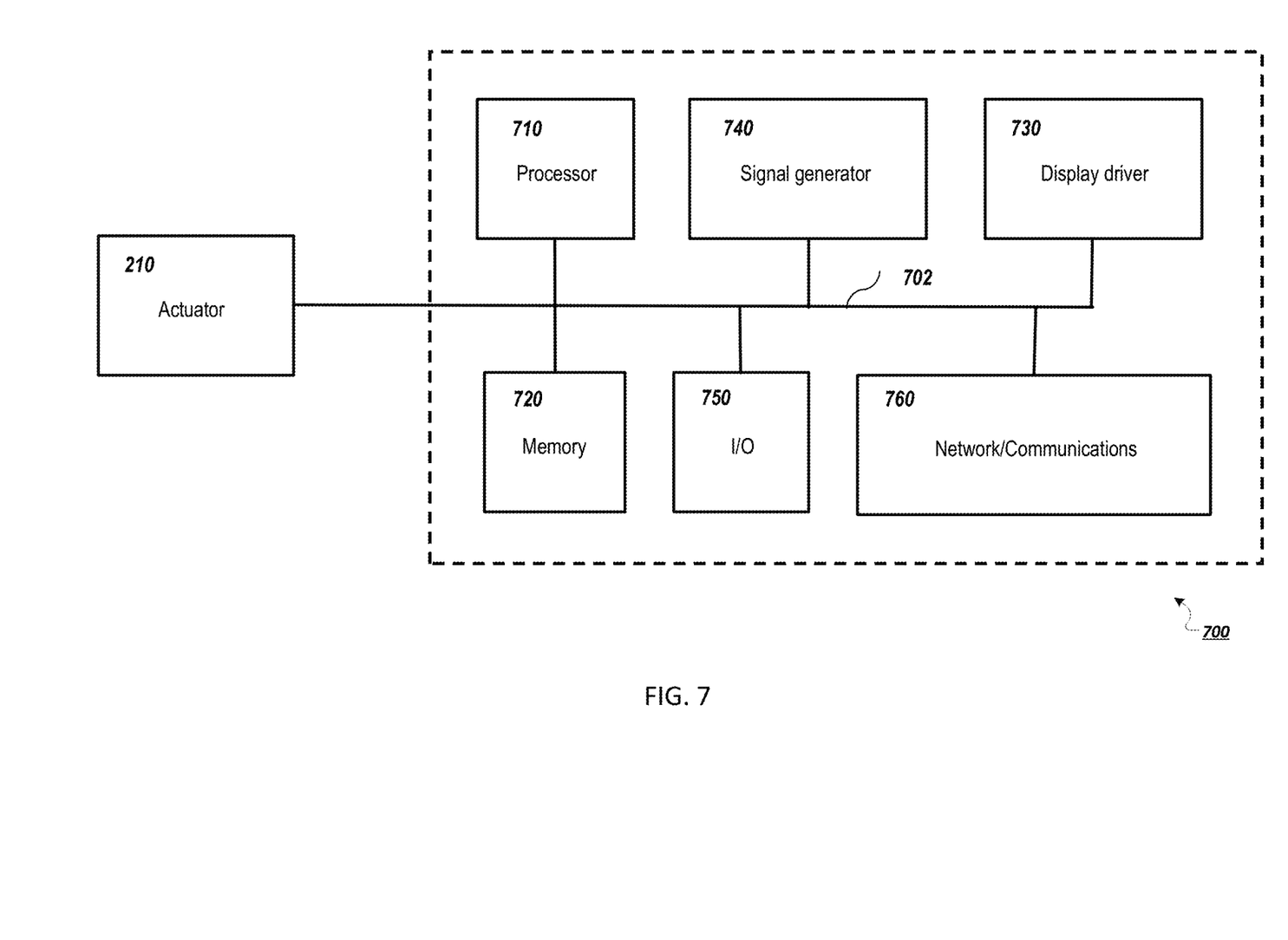
FIG. 7 is a schematic diagram of an embodiment of an electronic control module for a mobile device.

In general, the actuator and active coupling assemblies described above are controlled by an electronic control module, e.g., electronic control module 220 in FIG. 2 above. In general, electronic control modules are composed of one or more electronic components that receive input from one or more sensors and/or signal receivers of the mobile phone, process the input, and generate and deliver signal waveforms that cause actuator 210 to provide a suitable haptic response. Referring to FIG. 7, an exemplary electronic control module 700 of a mobile device, such as mobile device 100, includes a processor 710, memory 720, a display driver 730, a signal generator 740, an input/output (I/O) module 750, and a network/communications module 760. These components are in electrical communication with one another (e.g., via a signal bus 702) and with actuator 210.

Processor 710 may be implemented as any electronic device capable of processing, receiving, or transmitting data or instructions. For example, processor 710 can be a microprocessor, a central processing unit (CPU), an application-specific integrated circuit (ASIC), a digital signal processor (DSP), or combinations of such devices.

Memory 720 has various instructions, computer programs or other data stored thereon. The instructions or computer programs may be configured to perform one or more of the operations or functions described with respect to the mobile device. For example, the instructions may be configured to control or coordinate the operation of the device's display via display driver 730, signal generator 740, one or more components of I/O module 750, one or more communication channels accessible via network/communications module 760, one or more sensors (e.g., biometric sensors, temperature sensors, accelerometers, optical sensors, barometric sensors, moisture sensors and so on), and/or actuator 210.

Signal generator 740 is configured to produce AC waveforms of varying amplitudes, frequency, and/or pulse profiles suitable for actuator 210 and producing acoustic and/or haptic responses via the actuator. Although depicted as a separate component, in some embodiments, signal generator 740 can be part of processor 710. In some embodiments, signal generator 740 can include an amplifier, e.g., as an integral or separate component thereof.

Memory 720 can store electronic data that can be used by the mobile device. For example, memory 720 can store electrical data or content such as, for example, audio and video files, documents and applications, device settings and user preferences, timing and control signals or data for the various modules, data structures or databases, and so on. Memory 720 may also store instructions for recreating the various types of waveforms that may be used by signal generator 740 to generate signals for actuator 210. Memory 720 may be any type of memory such as, for example, random access memory, read-only memory, Flash memory, removable memory, or other types of storage elements, or combinations of such devices.

As briefly discussed above, electronic control module 700 may include various input and output components represented in FIG. 7 as I/O module 750. Although the components of I/O module 750 are represented as a single item in FIG. 7, the mobile device may include a number of different input components, including buttons, microphones, switches, and dials for accepting user input. In some embodiments, the components of I/O module 750 may include one or more touch sensor and/or force sensors. For example, the mobile device's display may include one or more touch sensors and/or one or more force sensors that enable a user to provide input to the mobile device.

Each of the components of I/O module 750 may include specialized circuitry for generating signals or data. In some cases, the components may produce or provide feedback for application-specific input that corresponds to a prompt or user interface object presented on the display.

As noted above, network/communications module 760 includes one or more communication channels. These communication channels can include one or more wireless interfaces that provide communications between processor 710 and an external device or other electronic device. In general, the communication channels may be configured to transmit and receive data and/or signals that may be interpreted by instructions executed on processor 710. In some cases, the external device is part of an external communication network that is configured to exchange data with other devices. Generally, the wireless interface may include, without limitation, radio frequency, optical, acoustic, and/or magnetic signals and may be configured to operate over a wireless interface or protocol. Example wireless interfaces include radio frequency cellular interfaces, fiber optic interfaces, acoustic interfaces, Bluetooth interfaces, Near Field Communication interfaces, infrared interfaces, USB interfaces, Wi-Fi interfaces, TCP/IP interfaces, network communications interfaces, or any conventional communication interfaces.

In some implementations, one or more of the communication channels of network/communications module 760 may include a wireless communication channel between the mobile device and another device, such as another mobile phone, tablet, computer, or the like. In some cases, output, audio output, haptic output or visual display elements may be transmitted directly to the other device for output. For example, an audible alert or visual warning may be transmitted from the mobile device 100 to a mobile phone for output on that device and vice versa. Similarly, the network/communications module 760 may be configured to receive input provided on another device to control the mobile device. For example, an audible alert, visual notification, or haptic alert (or instructions therefore) may be transmitted from the external device to the mobile device for presentation.

The actuator technology disclosed herein can be used in panel audio systems, e.g., designed to provide acoustic and/or haptic feedback. The panel may be a display system, for example based on OLED of LCD technology. The panel may be part of a smartphone, tablet computer, or wearable devices (e.g., smartwatch or head-mounted device, such as smart glasses).

Other embodiments are in the following claims.

What is claimed is:

1. A method of changing a frequency response of a panel audio loudspeaker, the method comprising:
activating, by an electronic control module, an actuator coupled to a panel of the panel audio loudspeaker to cause vibration of the panel to generate sound waves within a range of frequencies, the panel having a first edge and a second edge opposite the first edge, and the actuator being coupled to the panel away from the first and second edges; and
varying, by a passive coupling assembly coupling the panel to a chassis at the second edge of the panel, a mechanical impedance between the panel and the chassis sufficient to change a response of the panel to the actuator within the range of frequencies,
wherein the panel is coupled to the chassis at the first edge to prevent displacement of the panel from the chassis at the first edge during vibration of the panel by the actuator, and
the passive coupling assembly allows displacement of the panel from the chassis at the second edge during the vibration of the panel by the actuator, the passive coupling assembly comprising a spring fixedly connected to the panel.

2. The method of claim 1, wherein varying the mechanical impedance between the panel and the chassis comprises variably dampening, by the passive coupling assembly, motion of the panel at the second edge.

3. The method of claim 1, wherein varying the mechanical impedance between the panel and the chassis comprises varying the mechanical impedance based on a vibration frequency of the panel.

4. The method of claim 1, wherein the spring has a stiffness in a range from 1200 N/m to 2400 N/m.

5. The method of claim 1, wherein the passive coupling assembly has a resonance frequency in a range from 100 Hz to 1 kHz.

6. The method of claim 1, wherein the passive coupling assembly couples a mass to the panel.

7. The method of claim 6, wherein the mass is in a range from 0.1 grams to 10.0 grams.

8. The method of claim 1, wherein the passive coupling assembly is tuned to absorb energy at one or more frequencies in a range from 200 Hz to 20 KHz.

9. The method of claim 1, wherein the spring comprises a helical spring, a leaf spring, or a conical spring.

10. The method of claim 1, wherein the panel is coupled to the chassis at the first edge by a foam.

11. A panel audio loudspeaker, comprising:
a chassis;
a panel having a first edge and a second edge opposite the first edge;
an actuator coupled to the panel away from the first and second edges;
an electronic control module programmed to activate the actuator to cause vibration of the panel to generate sound waves within a range of frequencies; and
a passive coupling assembly coupling the panel to the chassis at the second edge of the panel and configured to vary a mechanical impedance between the panel and the chassis sufficient to change a response of the panel to the actuator within the range of frequencies,
wherein the panel is coupled to the chassis at the first edge to prevent displacement of the panel from the chassis at the first edge during vibration of the panel by the actuator, and
the passive coupling assembly allows displacement of the panel from the chassis at the second edge during the vibration of the panel by the actuator, the passive coupling assembly comprising a spring fixedly connected to the panel.

12. A system, comprising:
a chassis;

a panel having a first edge and a second edge opposite the first edge;

an actuator coupled to the panel away from the first and second edges, the actuator being adapted to cause vibration of the panel to generate sound waves within a range of frequencies;

a passive coupling assembly coupling the panel to the chassis at the second edge of the panel and configured to vary a mechanical impedance between the panel and the chassis sufficient to change a response of the panel to the actuator within the range of frequencies, wherein the panel is coupled to the chassis at the first edge to prevent displacement of the panel from the chassis at the first edge during vibration of the panel by the actuator, and the passive coupling assembly allows displacement of the panel from the chassis at the second edge during the vibration of the panel by the actuator, the passive coupling assembly comprising a spring fixedly connected to the panel.

\* \* \* \* \*